(12) United States Patent
Norton et al.

(10) Patent No.: US 6,849,580 B2
(45) Date of Patent: Feb. 1, 2005

(54) METHOD OF PRODUCING BIAXIALLY TEXTURED BUFFER LAYERS AND RELATED ARTICLES, DEVICES AND SYSTEMS

(75) Inventors: David P. Norton, Gainesville, FL (US); Venkat Selvamanickam, Wynantskill, NY (US)

(73) Assignees: University of Florida, Gainesville, FL (US); Superpower, Inc., Schenectady, NY (US)

( * ) Notice: Subject to any disclaimer, the term of this patent is extended or adjusted under 35 U.S.C. 154(b) by 41 days.

(21) Appl. No.: 10/457,184

(22) Filed: Jun. 9, 2003

(65) Prior Publication Data

US 2004/0248743 A1 Dec. 9, 2004

(51) Int. Cl.$^7$ ............................. H01B 12/00; H01F 6/00; H01L 39/00

(52) U.S. Cl. ..................... 505/237; 505/434; 505/470; 505/477

(58) Field of Search .................... 505/230, 237, 505/238, 430, 434, 470, 473–477, 480; 428/699–701, 930; 174/125.1; 438/2; 427/62

(56) References Cited

U.S. PATENT DOCUMENTS

| | | | | | |
|---|---|---|---|---|---|
| 5,248,564 A | * | 9/1993 | Ramesh | ....................... | 428/688 |
| 5,650,378 A | * | 7/1997 | Iijima et al. | ................. | 505/473 |
| 5,739,086 A | * | 4/1998 | Goyal et al. | ................. | 505/473 |
| 5,872,080 A | * | 2/1999 | Arendt et al. | ................ | 505/238 |
| 5,964,966 A | * | 10/1999 | Goyal et al. | ................. | 148/426 |
| 6,190,752 B1 | * | 2/2001 | Do et al. | ..................... | 428/141 |

* cited by examiner

Primary Examiner—Stanley S. Silverman
Assistant Examiner—Colleen P. Cooke
(74) Attorney, Agent, or Firm—Akerman Senterfitt (57) ABSTRACT

A superconductor article includes a substrate and a first buffer film disposed on the substrate. The first buffer film has a uniaxial crystal texture characterized (i) texture in a first crystallographic direction that extends out-of-plane of the first buffer film with no significant texture in a second direction that extends in-plane of the first buffer film, or (ii) texture in a first crystallographic direction that extends in-plane of the first buffer film with no significant texture in a second direction that extends out-of-plane of the first buffer film. A second buffer film is disposed on the first buffer film, the second buffer film having a biaxial crystal texture. A superconductor layer can be disposed on the second buffer film. Ion-beam assisted deposition (IBAD) can be used to deposit the second buffer film.

35 Claims, 5 Drawing Sheets

METHOD OF PRODUCING BIAXIALLY TEXTURED BUFFER LAYERS AND RELATED ARTICLES, DEVICES AND SYSTEMS

CROSS-REFERENCE TO RELATED APPLICATIONS

Not Applicable

STATEMENT REGARDING FEDERALLY SPONSORED RESEARCH OR DEVELOPMENT

Not applicable

FIELD OF THE INVENTION

The invention relates to biaxially textured buffer layers and articles, devices and systems made therefrom, including superconductor wires and tapes.

BACKGROUND OF THE INVENTION

Much of the effort to develop a high temperature superconducting (HTS) wire or tape has focused on coated conductors based on the epitaxial growth of high temperature superconducting (HTS) films on tapes that possess a biaxially-textured surface. Superconducting films with critical current densities in excess of 1 MA/cm$^2$ at 77 K and self-field have been achieved for epitaxial $YBa_2Cu_3O_7$ films on biaxially-textured tapes produced either by ion-beam assisted deposition (IBAD) or thermomechanically-textured metals.

In previous work involving IBAD, the synthesis of the biaxially-textured buffer layer suitable for HTS films capable of carrying high critical current densities has employed the ion-assist process to produce both the in-plane and out-of-plane texture. In order to realize an HTS film possessing a high critical current on a biaxially textured substrate, the buffer layer architecture should satisfy rigorous requirements. The grains within the topmost buffer layer construct desirably provide a common in-plane and out-of-plane crystallographic texture with a mosaic spread of generally less than 20 degrees, with lower mosaic spreads such as less than 10 degrees providing better superconducting articles.

The top layer should generally be chemically compatible with the superconductor so as to not react during superconductor deposition and be mechanically robust to prevent microcrack formation at the HTS/buffer layer interface. To date, biaxially textured buffer layers that have met these objectives generally rely on the use of the ion-assist (IBAD) process in determining the in-plane and out-of-plane texture. For example, biaxially textured yttria-stabilized zirconia (YSZ) buffer layer can be formed by IBAD with the (100) in-plane and (001) out-of-plane texture by directing an Ar+ beam flux oriented 55 degrees from the surface normal, which corresponds to the [111] direction for a (001)-oriented cubic material.

While the above-described IBAD process has provided the desired biaxial texture requiring a relatively high thickness (>1 μm), such as by use of a YSZ film deposited in the presence of the Ar+ beam, the process is relatively slow and as a result expensive. The speed and price of such process is a significant issue in the large-scale production of superconducting tapes since it would affect the ability to produce a low-cost HTS tape. A second approach involves the IBAD deposition of MgO requiring a sub-10 nm control of the nucleation process, typically employing an in-situ monitoring technique, such as reflection high energy electron diffraction, for controlling the crystallographic texture. This approach is difficult to employ for large-scale production. Also, the quality of MgO films deposited by IBAD has been found to be extremely sensitive to minor variations in the processes and structures used for this material.

Accordingly, there is a need in the art for improved superconductor components, including coated HTS conductors, processes for forming same, and articles incorporating same. In particular, there is a need for commercially viable HTS conductors having characteristics enhancing large-scale production, and processes for forming the same.

Accordingly, there is also a need in the art for an alternative technique that would require less thickness than that required for IBAD of YSZ, but would be more robust and less sensitive than the IBAD process for MgO.

SUMMARY OF THE INVENTION

A superconductor article includes a substrate and a first buffer film disposed on the substrate. The first buffer film has a uniaxial crystal texture characterized by (i) texture in a first crystallographic direction that extends out-of-plane of the first buffer film with no significant texture in a second direction that extends in-plane of the first buffer film, or (ii) texture in a first crystallographic direction that extends in-plane of the first buffer film with no significant texture in a second direction that extends out-of-plane of the first buffer film. A second buffer film is disposed on the first buffer film, the second buffer film having a biaxial crystal texture. A superconductor layer can be disposed on the second buffer film. As used herein, the term "disposed on" is used to refer to the relative location of the elements in an article, and does not necessarily require direct contact between the described elements or components (unless otherwise described as such), and may include intervening layers or films. Accordingly, the term is used in a general sense regarding orientation or location, as generally illustrated in the drawings. For example, a protective layer can be disposed between the substrate and the first buffer film.

The uniaxially textured crystallographic direction of the first buffer film can be in-plane or out-of-plane. In the case of out-of-plane texture, the out-of-plane crystal texture can be generally aligned along the [001] crystal direction. The out-of-plane texture can have a mosaic spread no more than about 30 degrees, preferably no more than about 20 degrees, or more preferably no more than about 10 degrees.

The first buffer film can have a rock-salt-like crystal structure or may exhibit anisotropic growth habits. The first buffer film can include $REBa_2Cu_3O_7$, $Bi_4Ti_3O_{12}$, MgO or NiO. The substrate can be a metal alloy, such as a Ni-based alloy.

The biaxially textured second buffer film can be aligned along a first axis along the [001] crystal direction, and along a second axis having a crystal direction selected from the group consisting of [111], [101], [113], [100], and [010]. The second buffer film can have a rock-salt-like crystal structure. In this embodiment, the second buffer film can be MgO, NiO, YSZ, $CeO_2$, $Y_2O_3$, $TiO_2$, $SnO_2$, $Mn_3O_4$, $Fe_3O_4$, $Cu_2O$ or $RE_2O_3$, where RE is a rare earth element.

The superconductor article can provide a Jc of at least 0.5 MA/cm$^2$ at 77 K and self-field, and preferably at least 1.0 MA/cm$^2$ at 77 K and self-field. The superconductor layer can comprise $REBa_2Cu_3O_3$, where RE is a rare earth element. RE can comprise Y. The superconductor article can comprise a superconductor tape.

A power cable includes a plurality of superconductive tapes, each tape comprising a substrate, a first buffer film disposed on the substrate, the first buffer film having uniaxial crystal texture characterized by (i) texture in a first crystallographic direction that extends out-of-plane of the first buffer film with no significant texture in a second direction that extends in-plane of the first buffer film, or (ii) texture in a first crystallographic direction that extends in-plane of the first buffer film with no significant texture in a second direction that extends out-of-plane of the first buffer film. A second buffer film is disposed on the first buffer film, the second buffer film having a biaxial crystal texture. A superconductor layer is disposed on the second buffer film. A conduit can be provided for passage of coolant fluid through the cable. The superconductive tapes can be wrapped around the conduit. The power cable can comprise a power transmission cable or a power distribution cable.

A power transformer includes a primary winding, and a secondary winding, wherein at least one of the primary winding and secondary winding comprises a wound coil of superconductive tape as described above. The secondary winding can have fewer or more windings as compared to the primary winding.

A power generator includes a shaft coupled to a rotor comprising electromagnets comprising rotor coils, and a stator comprising a conductive winding surrounding the rotor, wherein at least one of the winding and the rotor coils comprise a superconductive tape as described above. At least one of the rotor coils can include the superconductive tape.

A power grid comprising a power generation station includes a power generator, a transmission substation comprising a plurality of power transformers for receiving power from the power generation station and stepping-up voltage for transmission, a plurality of power transmission cables for transmitting power from the transmission substation, and a power substation for receiving power from the power transmission cables. The power substation comprises a plurality of power transformers for stepping-down voltage for distribution. A plurality of power distribution cables are provided for distributing power to end users, wherein at least one of the power distribution cables, power transmission cables, transformers of the power substation, transformers of the transmission substation, and the power generator includes a plurality of superconductive tapes as described above.

An electronically active article comprises a substrate, a first buffer film disposed on the substrate, the first buffer film having uniaxial crystal texture characterized by (i) texture in a first crystallographic direction that extends out-of-plane of the first buffer film with no significant texture in a second direction that extends in-plane of the first buffer film, or (ii) texture in a first crystallographic direction that extends in-plane of the first buffer film with no significant texture in a second direction that extends out-of-plane of the first buffer film. A second buffer film is disposed on the first buffer film, the second buffer film having a biaxial crystal texture. An electronically active layer is disposed on the second buffer film. The electronically active layer can be a semiconductor, a photovoltaic, a ferroelectric or an optoelectric layer.

A method for producing a biaxially textured article comprises the steps of providing a substrate, forming a first buffer film on the substrate, the first buffer film having uniaxial crystal texture characterized by (i) texture in a first crystallographic direction that extends out-of-plane of the first buffer film with no significant texture in a second direction that extends in-plane of the first buffer film, or (ii) texture in a first crystallographic direction that extends in-plane of the first buffer film with no significant texture in a second direction that extends out-of-plane of the first buffer film and depositing a second buffer film with ion assist on the first buffer film, wherein the resulting second buffer film has biaxial texture. The method can include the step of depositing a superconductor layer on the second buffer film. Ion-beam assisted deposition (IBAD) can be used to deposit the second buffer film.

BRIEF DESCRIPTION OF THE DRAWINGS

These and other features, aspects, and advantages of the present invention will become better understood when the following detailed description is read with reference to the accompanying drawings in which like characters represent like parts throughout the drawings.

DETAILED DESCRIPTION OF THE PREFERRED EMBODIMENTS

Embodiments of the present invention provide a novel HTS article, methods for forming same, and devices and systems incorporating the same. According to one feature, a method is provided for forming a biaxially textured buffer layer article using a two-step process and associated articles, devices and systems. The first step provides a first buffer film having uniaxial texture, typically characterized by (i) texture in a first crystallographic direction that extends out-of-plane of the first buffer film with no significant texture in a second direction that extends in-plane of the first buffer film, or (ii) texture in a first crystallographic direction that extends in-plane of the first buffer film with no significant texture in a second direction that extends out-of-plane of the first buffer film. The single crystallographic direction can be one of an in-plane direction or an out-of-plane direction, wherein the other crystallographic directions has no significant crystallographic texture. Thus, the unixially textured first buffer film does not provide biaxial texture.

According to one embodiment the uniaxial crystal texture extends out-of-plane, with no significant texturing in-plane. Typically, it is considered that 'in-plane' is defined by two mutally perpendicular directions in the plane of the buffer film. According to another embodiment, the uniaxial crystal texture extends in one of the in-plane directions, with no significant texturing out-of-plane, and no texturing in the mutually perpendicular in-plane direction. As used herein, the term "texture", whether referring to in-plane or out-of-plane texture, refers to a grain-to-grain crystallographic misorientation "mosaic spread" of the respective layer. Typically, the mosaic spread for a textured layer is less than about 30 degrees, such as less than about 20 degrees, 15 degrees, 10 degrees, or 5 degrees, but is generally finite typically being greater than about 1°. According to one embodiment, the term "no significant texture," generally refers to a grain-to-grain misorientation "mosaic spread" of the respective layer being greater than about 30 degrees and including generally random polycrystalline arrangements.

Regarding the out-of-plane crystallographic texture, the mosaic spread is generally represented by a full-width-at-half-maximum value of an x-ray diffraction peak, such as obtained by a (001) pole figure measurement. In this case, the (001) crystallographic planes of the grains are aligned and thus textured in a direction perpendicular to the normal to the film within an angular spread of less than about 30 degrees.

A second buffer film is disposed on the first buffer film, the second buffer film having a biaxial crystal texture. A biaxially textured second buffer film by definition has both in-plane and out-of-plane crystal texture. A biaxially textured layer is defined herein as a polycrystalline material in which both the crystallographic in-plane and out-of-plane grain-to-grain misorientation of the topmost layer is less than about 30 degrees, such as less than about 20 degrees, 15 degrees, 10 degrees, or 5 degrees, but is generally finite typically greater than about 1°. The degree of biaxial texture can be described by specifying the distribution of grain in-plane and out-of-plane orientations as determined by x-ray diffraction. A full-width-half-maximum (FWHM) of the rocking curve of the out-of-plane ($\Delta\theta$) and in-plane ($\Delta\phi$) reflection can be determined. Therefore, the degree of biaxial texture can be defined by specifying the range of $\Delta\theta$ and $\Delta\phi$ for a given sample.

The first buffer film is generally formed without the use of an ion beam while the second step which forms the second buffer layer film uses an ion-beam assisted deposition (IBAD) process to produce a biaxially textured layer portion on top of the first buffer layer portion. The ability to obtain a biaxially textured buffer surface using IBAD without the associated manufacturing issues relating to use of IBAD for the entire buffer layer can produce high performance articles substantially more efficiently and economically as compared to conventional IBAD processing. Embodiments of the present invention thus attenuate the general use of IBAD processing to produce a biaxial texture in the full buffer layer thickness, and additionally, reduce the need for highly controlled IBAD processing conditions, since lower process tolerances can be accepted, which is preferable in a manufacturing environment. This is believed to be due to the concept that it is energetically favorable, from a crystal nucleation and growth viewpoint, for the deposited material to align along the uniaxial crystallographic direction during deposition, creating more flexibility in IBAD film processing.

A biaxially textured electronically active layer can be disposed on the biaxially textured buffer layers formed according to embodiments of the invention. The electronically active layer may be a superconductor, a semiconductor, a photovoltaic, a ferroelectric or an optoelectric, or any other electromagnetic device wherein grain boundary control is important. In this regard, aspects of the present invention are particularly suitable for providing high temperature superconductor components, in which the electronically active layer is formed principally of a superconducting material. Aspects of the invention are particularly well suited for the formation of electronically active wire and tape (hereafter a "tape") articles which have biaxial texture. As used herein, the term "tape" refers to an article having an aspect ratio not less than about 1,000, the aspect ratio meaning the ratio of longest dimension (length) to next longest dimension (width). Typically, the aspect ratio is greater than about $10^4$, and even greater than about $10^5$.

The biaxially textured buffer layers are suitable for the formation of a high temperature superconducting article which provides a critical current density in excess of about 0.5 MA/cm$^2$ at about 77 K and self-field, and preferably in excess of about 1 MA/cm$^2$. Embodiments of the invention is also useful for a variety of other electronic applications in which sharp crystallographic texture is important.

Figure 1:
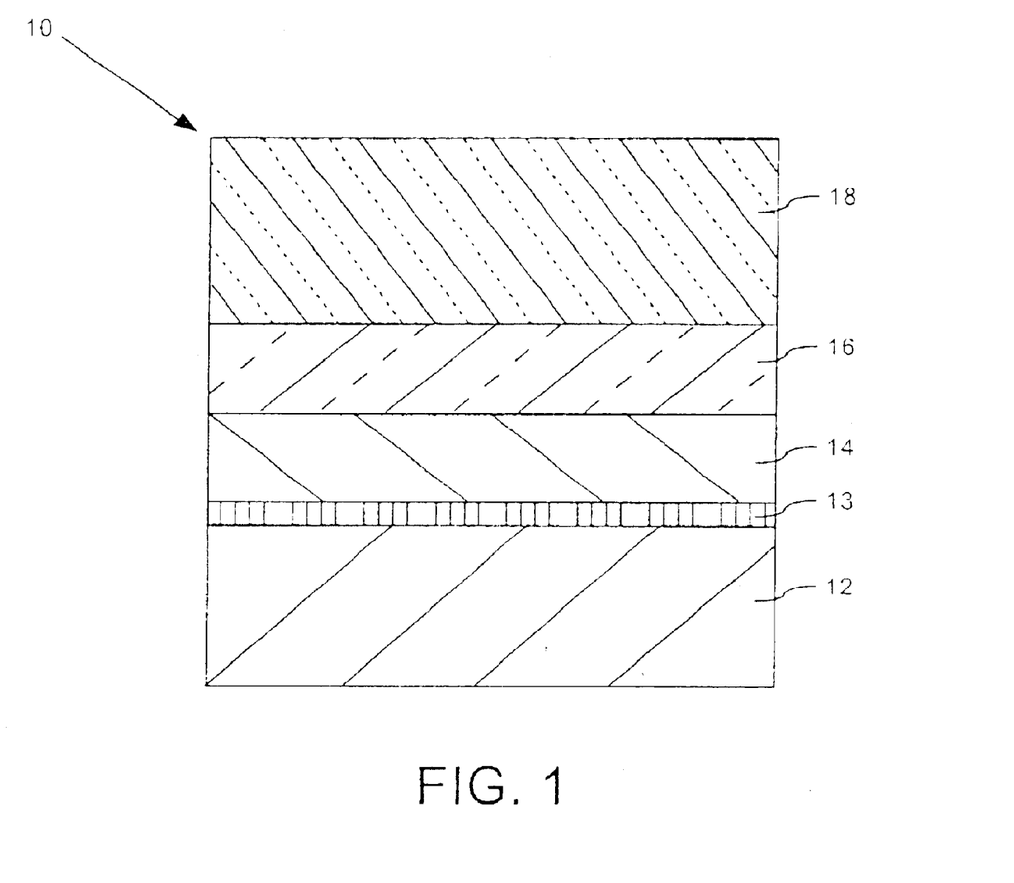
FIG. 1 illustrates a superconducting tape article, according to an embodiment of the invention.

FIG. 1 shows a tape article 10 according to an embodiment of the invention having a multi-layer composition including a textured superconductor tape 18 having biaxial texture along its entire length. The tape article 10 is expected to be particularly useful for increasing the current carrying capability and reducing AC resistive losses of power transmission lines. Superconductor article 10 consists of a substrate 12. The substrate 12 can be a metal or polycrystalline ceramic. In case of a metal, the substrate 12 can be an alloy, such as a Ni-based alloy. Texture in the substrate 12 is generally not required. Thus, substrate 12 can be polycrystalline or amorphous. Polycrystalline substrates may be utilized for some applications requiring certain thermal, mechanical, and electrical properties offered by such materials, such as commercially available Ni-based alloys, such as the Hastelloy® group of high performance substrate materials. The substrate 12 provides support for the superconductor article 10, and can be fabricated over long lengths and large areas using the aspects of the present invention. When the superconductor tape is of long length (e.g. 1 km), first buffer layer 14 and second buffer layer 16 may be deposited on biaxially-textured substrate surface 12 using a suitable translation process, such as reel-to-reel translation.

Optional protective layer 13 is generally polycrystalline and is disposed on the top surface of substrate 12. Protective layer 13 is preferably used when buffer layer 14 is chemically incompatible with substrate 12. The polycrystalline protective layer is preferably an oxide, such as cerium oxide or yttria-stabilized zirconia (YSZ).

A second buffer layer 16 is disposed on the first buffer layer 14. First buffer layer 14 provides texture in a first crystallographic direction that extends out-of-plane of the first buffer film with no significant texture in a second direction that extends in-plane of the first buffer film, or (ii) texture in a first crystallographic direction that extends in-plane of the first buffer film with no significant texture in a second direction that extends out-of-plane of the first buffer film, while second buffer layer 16 provides biaxial texture. Epitaxially-grown superconducting layer 18 is disposed on biaxially texture buffer layer 16.

Although not shown in FIG. 1, at least one epitaxial film can be provided between the second buffer layer 16 and the superconductor layer 18. In addition, a noble metal layer can overlay the superconductor layer 18, such as Ag.

This high degree of out-of-plane texture in first buffer layer 14 can be achieved either through the anisotropic growth habits of selected materials or by preferential selection of energetically favorable growth orientations of selected materials. In this application, the film that produces the uniaxial texture, such as out-of plane texture, is provided without the need for ion assist and is referred to as Layer 1. For example, Layer 1 can be a polycrystalline material where the energetically favorable growth direction is <100> along the film normal. Examples are rock-salt structures such as MgO and NiO, which have a tendency to align preferentially in the energetically favorable direction of <100> irrespective of the underlying substrate orientation.

U.S. Pat. No. 6,190,752 to Do et al. entitled "Thin films having rock-salt-like structure deposited on amorphous surfaces" provides detailed information regarding rock-salt structures and available species.

Several polycrystalline thin-film materials, including various oxides, have anisotropic growth habits as they tend to align a specific crystallographic axis along the surface normal of a substrate for certain deposition conditions. In terms of anisotropic growth, several multi-cation oxides can be used. For example, the use of $REBa_2Cu_3O_7$, where RE is a rare earth element such as $YBa_2Cu_3O_7$, and $Bi_4Ti_3O_{12}$, and wherein both exhibit out of plane (c-axis) oriented film growth on randomly oriented substrates. Uniaxially textured films can be used as buffer layer 14 which can act as an initial template for epitaxial growth (including IBAD films) to form biaxially textured buffer layer 16. Buffer layer 14 generally has a thickness within a range about 100 to about 3000 Angstroms. Buffer layer 14 is preferably aligned along the [100] direction and can be deposited by sputtering, pulsed laser deposition, or evaporation.

Second buffer layer 16 is a layer in which in-plane texture is generally induced due to the ion beam and is also referred to herein as Layer 2. Without any ion beam present during epitaxy, the epitaxial growth of buffer layer 16 on the uniaxial out-of-plane textured buffer layer 14 will reproduce the uniaxial texture achieved in buffer layer 14. By imposing an ion beam (e.g. Ar) along a high-symmetry direction of buffer layer 16 during epitaxy of buffer layer 16, the growth of grains oriented with a preferred axis aligned along the ion beam direction are generally preferred over those grains with other orientations. This subsequent IBAD growth induces an in-plane texture component in buffer layer 16 that does not exist in buffer layer 14, while still maintaining the out-of-plane texture.

The second buffer layer 16 generally has a thickness within a range of about 100 to about 5000 Angstroms. The superconductor layer 18 thickness is generally from about 500 to about 10,000 nm. The biaxially textured second buffer layer 16 is preferably aligned along a first axis having along a [001] crystal direction, and along a second axis having a crystal direction selected from the group consisting of [111], [101], [113], [100], and [010]. The second buffer layer 16 can have a rock-salt-like crystal structure and comprise MgO, NiO or be selected from YSZ, $CeO_2$, $Y_2O_3$, $TiO_2$, $SnO_2$, $Mn_3O_4$, $Fe_3O_4$, $Cu_2O$, or $RE_2O_3$, wherein RE is a rare earth element. Buffer layer 16 can be deposited by sputtering or evaporation.

Superconductor layer 18 is preferably an oxide superconductor. The oxide superconductor is preferably selected from $REBa_2Cu_3O_7$ where RE is a rare earth element, such as Y, and related compounds. The superconductor article 10 can provide a Jc of at least about 0.5 $MA/cm^2$ at about 77 K and self-field, and preferably at least about 1 $MA/cm^2$.

Although aspects of the invention are generally described using a c-axis textured first buffer layer 14, the invention is in no way limited to this embodiment. In another embodiment of the invention, the uniaxial crystal structure in the first buffer film 14 could also be along one direction within the plane of the film (a-axis or b-axis). In this embodiment, there is no preferential texture in a plane perpendicular to the axis along which the crystals are textured within the film plane (c-axis). One example of this embodiment is that of fiber texture, where a preferential uniaxial texture is present along the long direction of a tape or a wire but no preferential texture is present in the plane perpendicular to this direction.

A general embodiment of the invention involves providing a substrate for film growth. The substrate is cleaned with solvents, such as acetone, methanol, and trichloroethylene. The substrate is mounted in a deposition chamber suitable for thin film deposition. A polycrystalline protective layer is then optionally deposited on the substrate. The polycrystalline layer prevents a chemical reaction from occurring between Layer 1 and the substrate.

The protective layer coated substrate is heated in an ambient suitable for the deposition of an anisotropic thin film or a thin film whose energetically favorable growth direction is <100> (layer 1). Layer 1 is then deposited and provides out-of-plane (c-axis) texture without the need for ion assist. The Layer 1 coated substrate is then transferred to a thin-film deposition system equipped with an ion gun. The substrate is heated to a temperature suitable for the epitaxial growth of Layer 2 on Layer 1. Vacuum deposition is employed to deposited Layer 2 on Layer 1 in the presence of the ion beam, which is directed along a preferred crystallographic direction of the material constituting Layer 2 to induce in-plane texture during epitaxy.

The invention is useful for a wide variety of applications, particularly superconductor applications. Regarding superconductor applications, the invention can be used to form high temperature superconducting wires or tapes which can be used for transmission lines, motors, generators, or high-field magnet applications.

Figure 2:
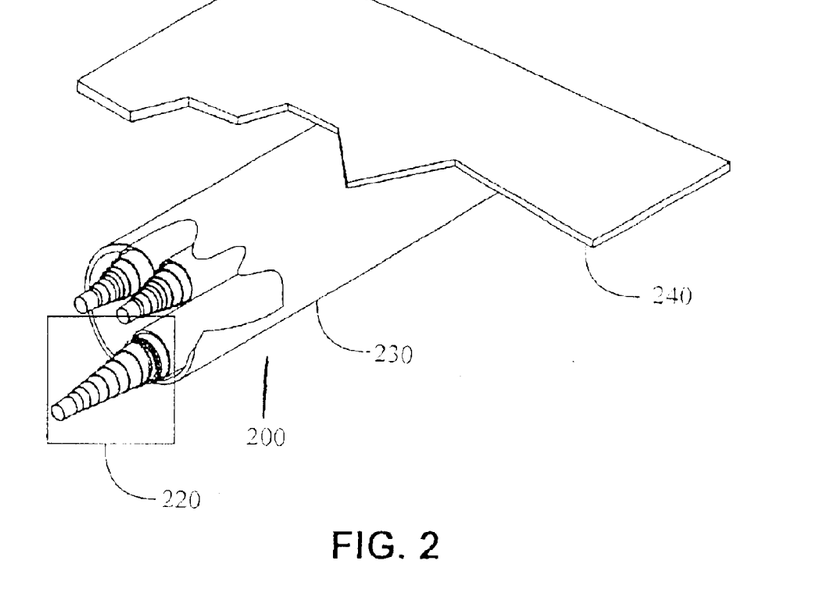
FIG. 2 illustrates a power cable, according to an embodiment of the invention.

FIG. 2 illustrates a power cable 200, according to an embodiment of the invention. Power cable 200 shown includes three superconducting cables 220 arranged in a trefoil arrangement where all three phases are housed in the same thermally insulating conduit 230. Ground plane 240 is also shown. The phases are situated as close together as physically possible. Although not shown, other arrangements are possible, including a concentric arrangement where the 3 cables are situated concentrically.

Figure 3:
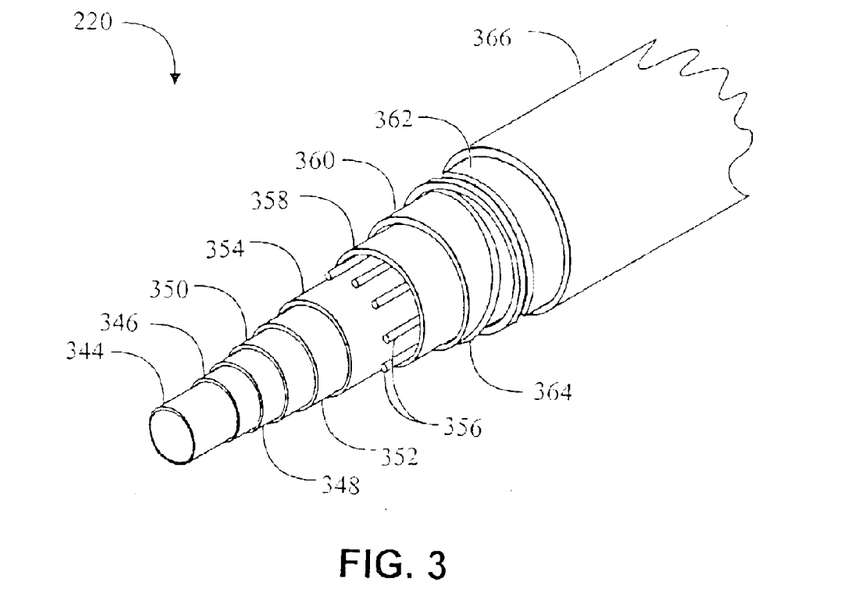
FIG. 3 illustrates details of a single exemplary superconducting cable, according to another embodiment of the invention.

FIG. 3 shows details of a single exemplary superconducting cable 220. Proceeding from the outside to the inside of cable 220, cable 220 includes enclosure 366, skid wires 364, corrugated steel 362 and thermal insulator 360. $LN_2$ duct 358 provides refrigerant to cable 220 and is disposed on centering wires 356. Copper shield 354 is provided and is disposed on superconductor tape layer 352. Dielectric tape 350 is disposed between tape layer 352 and copper shield 348. Another superconductor tape layer 346 is beneath copper shield 348. Former/duct 344 provides a passage of coolant fluid, such as liquid nitrogen ($LN_2$) refrigerant which permits inexpensive cooling to temperatures above the freezing point for nitrogen (which is at about 63.3 K). The power cable 200 can be used as a power transmission cable or a power distribution cable.

Figure 4:
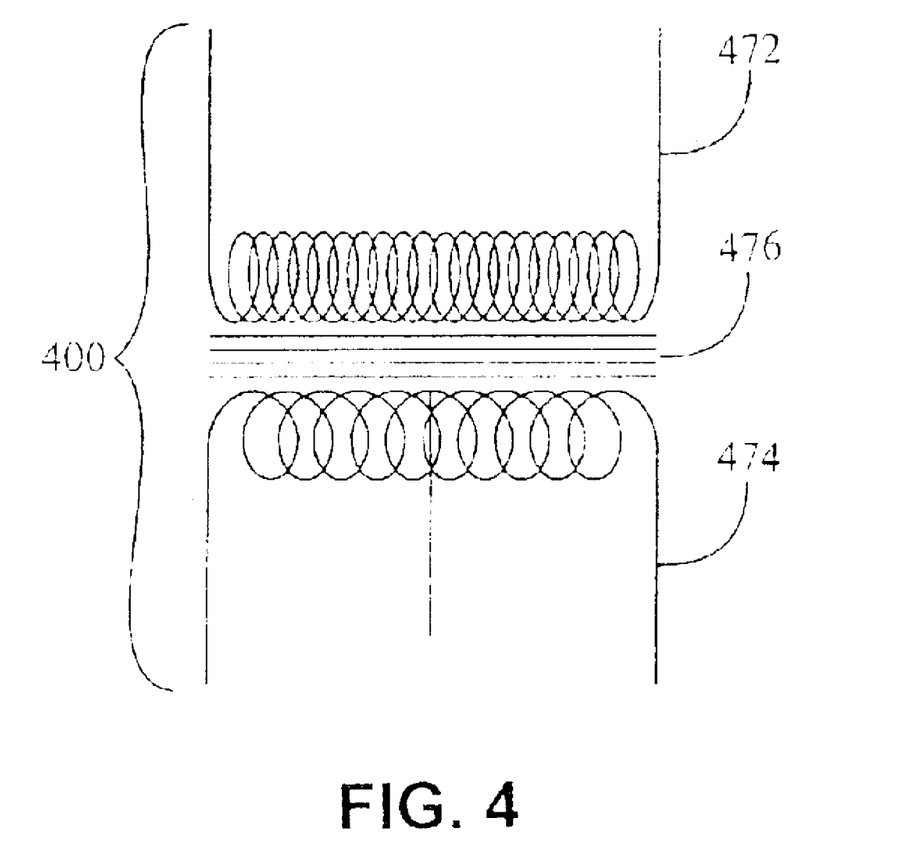
FIG. 4 illustrates a power transformer, according to yet another embodiment of the invention.

FIG. 4 illustrates power transformer 400, according to another embodiment of the invention. Power transformer 400 includes a primary winding 472, a secondary winding 474 and core 476. At least one of the primary winding 472 and secondary winding 474 comprises a wound coil of superconductive tape as described above embedded in an insulaing material such as epoxy. The secondary winding 474 can have fewer or more windings as compared to the primary winding 472.

Figure 5:
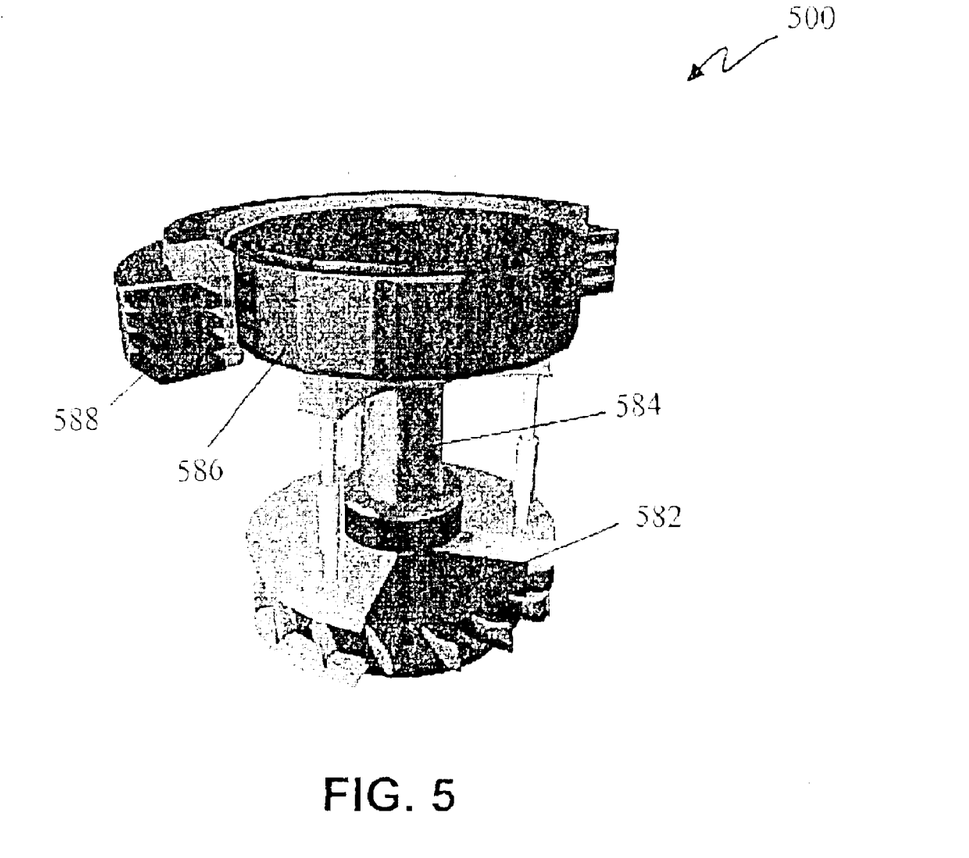
FIG. 5 illustrates a power generator, according to an embodiment of the invention.

FIG. 5 illustrates power generator 500, according to an embodiment of the invention. Power generator 500 includes a turbine 582 and a shaft 584 coupled to a rotor 586 comprising electromagnets comprising rotor coils, and a stator 588 comprising a conductive winding surrounding the rotor, wherein at least one of the winding and the rotor coils comprises a superconductive tape as described above.

Figure 6:
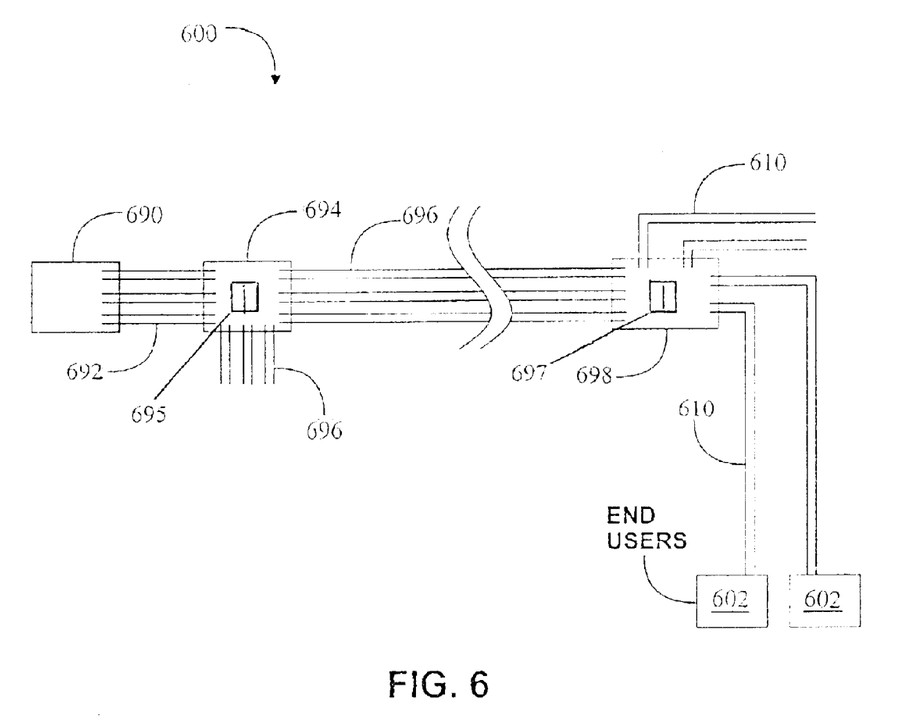
FIG. 6 illustrates a power grid, according to another embodiment of the invention.

FIG. 6 illustrates a power grid 600, according to another embodiment of the invention. Power grid 600 includes a power generation station comprising a power generator plant 690 and transmission lines 692 to deliver power to transmission substation 694. Transmission substation 694 includes transformers 695. Power transmission cables 696 emanate from transmission substation 694. Power transmission cables 696 deliver power from transmission substation 694 to power substation 698 which includes a plurality of power transformers 697 for stepping-down voltage for distribution. Power distribution cables 610 deliver power from power substation 698 to end users 602. At least one of the power distribution cables 610, power transmission cables 696, transformers 697 of the power substation 698, transformers of the transmission substation 695, and the power generator plant 690 comprise a plurality of superconductive tapes as described above.

EXAMPLES

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

Example 1

A Ni-based alloy substrate is provided for film growth. The substrate is cleaned with solvents, such as acetone, methanol, and trichloroethylene. The substrate is mounted in a pulsed-laser deposition chamber for thin film deposition. A polycrystalline yttria-stabilized zirconia (YSZ) protective layer is deposited on the substrate using pulsed laser deposition at about 25° C. under vacuum. This protective layer prevents chemical reactions between layer 1 and the substrate.

The coated substrate is heated to about 700° C. in vacuum for the deposition of an $YBa_2Cu_3O_7$ thin film (Layer 1). A $YBa_2Cu_3O_7$ film of thickness about 300 nm is deposited at about 700° C. in about 200 mTorr of oxygen. The film is c-axis oriented, but randomly oriented in-plane. The substrate is then transferred to a thin-film deposition system equipped with an ion gun. The substrate is heated to a temperature suitable for the epitaxial growth of MgO on $YBa_2Cu_3O_7$ on Layer 1. Pulsed laser deposition is employed to deposit epitaxial MgO on the $YBa_2Cu_3O_7$ template. The MgO layer will be (001) textured. This is followed by the growth of $CeO_2$ in the presence of an Ar ion beam, which is directed along either the [111] or [110] crystallographic direction of $CeO_2$.

Example 2

A Ni-based alloy substrate is provided for film growth. The substrate is cleaned with solvents, such as acetone, methanol, and trichloroethylene. The substrate is mounted in a pulsed-laser deposition chamber for thin film deposition. A MgO film of thickness of about 100 nm (Layer 1) is deposited at about 25° C. in vacuum. The MgO layer will be (001) textured. The coated substrate is then transferred to a thin-film deposition system equipped with an ion gun. A second layer of MgO (Layer 2) is grown in the presence of an Ar ion beam, the ion beam being directed along either the [111] or [110] crystallographic direction of MgO. The second MgO layer (Layer 2) will be biaxially textured.

It should be understood that the examples and embodiments described herein are for illustrative purposes only and that various modifications or changes in light thereof may be made by persons skilled in the art without departing from the scope of the present claims.

We claim:

1. A superconductor article, comprising:
   a substrate;
   a first buffer film disposed on said substrate, said first buffer film having uniaxial crystal texture characterized by (i) texture in a first crystallographic direction that extends out-of-plane of the first buffer film with no significant texture in a second direction that extends in-plane of the first buffer film, or (ii) texture in a first crystallographic direction that extends in-plane of the first buffer film with no significant texture in a second direction that extends out-of-plane of the first buffer film;
   a second buffer film disposed on said first buffer film, said second buffer film having a biaxial crystal texture; and
   a superconductor layer disposed on said second buffer film.

2. The superconductor article of claim 1, wherein said first buffer film has out-of-plane of crystallographic texture.

3. The superconductor article of claim 2, wherein said out-of-plane crystal texture is generally aligned along the [001] crystal direction.

4. The superconductor article of claim 2, wherein said out-of-plane texture has a mosaic spread no more than about 30 degrees.

5. The superconductor article of claim 2, wherein said out-of-plane texture has a mosaic spread no more than about 20 degrees.

6. The superconductor article of claim 2, wherein said out-of-plane texture has a mosaic spread no more than about 10 degrees.

7. The superconductor article of claim 1, wherein said first buffer film has a rock-salt-like crystal structure.

8. The superconductor article of claim 1, wherein the first buffer film comprises at least one selected from the group consisting of $REBa_2Cu_3O_7$, $Bi_4Ti_3O_{12}$, MgO, and NiO.

9. The superconductor article of claim 1, wherein said substrate comprises a metal alloy.

10. The superconductor article of claim 9, wherein said metal alloy comprises a Ni-based alloy.

11. The superconductor article of claim 1, wherein said biaxially textured second buffer film is aligned along a first axis along a [001] crystal direction, and along a second axis having a crystal direction selected from the group consisting of [111], [101], [113], [100], and [010].

12. The superconductor article of claim 1, wherein said second buffer film has a rock-salt-like crystal structure.

13. The superconductor article of claim 12, wherein said second buffer film comprises at least one material from the group consisting of MgO, NiO, YSZ, $CeO_2$, $Y_2O_3$, $TiO_2$, $SnO_2$, $Mn_3O_4$, $Fe_3O_4$, $Cu_2O$, and $RE_2O_3$, wherein RE is a rare earth element.

14. The superconductor article of claim 1, wherein said superconductor article provides a Jc of at least 0.5 $MA/cm^2$ at 77 K and self-field.

15. The superconductor article of claim 1, wherein said superconductor layer comprises $REBa_2Cu_3O_7$, wherein RE is a rare earth element.

16. The superconductor article of claim 15, wherein RE comprises Y.

17. The superconductor article of claim 1, wherein said article comprises a superconductor tape.

18. The superconductor article of claim 1, further comprising a protective layer disposed between said substrate and said first buffer film.

19. A power cable, comprising:
a plurality of superconductive tapes, each tape comprising a substrate, a first buffer film disposed on said substrate, said first buffer film having uniaxial crystal texture characterized by (i) texture in a first crystallographic direction that extends out-of-plane of the first buffer film with no significant texture in a second direction that extends in-plane of the first buffer film, or (ii) texture in a first crystallographic direction that extends in-plane of the first buffer film with no significant texture in a second direction that extends out-of-plane of the first buffer film, a second buffer film disposed on said first buffer film, said second buffer film having a biaxial crystal texture, and a superconductor layer disposed on said second buffer film.

20. The power cable of claim 19, further comprising a conduit for passage of coolant fluid.

21. The power cable of claim 20, wherein said superconductive tapes are wrapped around said conduit.

22. The power cable of claim 19, wherein said power cable comprises a power transmission cable or a power distribution cable.

23. A power transformer, comprising:
a primary winding; and
a secondary winding, wherein at least one of the primary winding and secondary winding comprising a wound coil of superconductive tape, said the superconductive tape comprising a substrate, a first buffer film disposed on said substrate, said first buffer film having uniaxial crystal texture characterized by (i) texture in a first crystallographic direction that extends out-of-plane of the first buffer film with no significant texture in a second direction that extends in-plane of the first buffer film, or (ii) texture in a first crystallographic direction that extends in-plane of the first buffer film with no significant texture in a second direction that extends out-of-plane of the first buffer film, a second buffer film disposed on said first buffer film, said second buffer film having a biaxial crystal texture, and a superconductor layer disposed on said second buffer film.

24. The power transformer of claim 23, wherein said secondary winding has fewer windings as compared to said primary winding.

25. The power transformer of claim 23, wherein said secondary winding has more windings as compared to said primary winding.

26. A power generator, comprising:
a shaft coupled to a rotor comprising electromagnets comprising rotor coils; and
a stator comprising a conductive winding surrounding the rotor, wherein at least one of said winding and said rotor coils comprises a superconductive tape comprising a substrate, a first buffer film disposed on said substrate, said first buffer film having uniaxial crystal texture characterized by (i) texture in a first crystallographic direction that extends out-of-plane of the first buffer film with no significant texture in a second direction that extends in-plane of the first buffer film, or (ii) texture in a first crystallographic direction that extends in-plane of the first buffer film with no significant texture in a second direction that extends out-of-plane of the first buffer film, a second buffer film disposed on said first buffer film, said second buffer film having a biaxial crystal texture, and a superconductor layer disposed on said second buffer film.

27. The power generator of claim 26, wherein at least one of said rotor coils contain said superconductive tape.

28. A power grid, comprising:
a power generation station comprising a power generator;
a transmission substation comprising a plurality of power transformers for receiving power from the power generation station and stepping-up voltage for transmission;
a plurality of power transmission cables for transmitting power from the transmission substation;
a power substation for receiving power from the power transmission cables, said power substation comprising a plurality of power transformers for stepping-down voltage for distribution; and
a plurality of power distribution cables for distributing power to end users, wherein at least one of the power distribution cables, power transmission cables, transformers of the power substation, transformers of the transmission substation, and the power generator comprises a plurality of superconductive tapes, each superconductive tape comprising a substrate, a first buffer film disposed on said substrate, said first buffer film having uniaxial crystal texture characterized by (i) texture in a first crystallographic direction that extends out-of-plane of the first buffer film with no significant texture in a second direction that extends in-plane of the first buffer film, or (ii) texture in a first crystallographic direction that extends in-plane of the first buffer film with no significant texture in a second direction that extends out-of-plane of the first buffer film, a second buffer film disposed on said first buffer film, said second buffer film having a biaxial crystal texture, and a superconductor layer disposed on said second buffer film.

29. An electronically active article, comprising:
a substrate;
a first buffer film disposed on said substrate, said first buffer film having uniaxial crystal texture characterized by (i) texture in a first crystallographic direction that extends out-of-plane of the first buffer film with no significant texture in a second direction that extends in-plane of the first buffer film, or (ii) texture in a first crystallographic direction that extends in-plane of the first buffer film with no significant texture in a second direction that extends out-of-plane of the first buffer film;
a second buffer film disposed on said first buffer film, said second buffer film having a biaxial crystal texture; and
an electronically active layer disposed on said second buffer film.

30. The article of claim 29, wherein said electronically active layer is selected from the group consisting of a semiconductor, a photovoltaic, a ferroelectric or an optoelectric.

31. A method of producing a biaxially textured article, comprising the steps of:
providing a substrate;
forming a first buffer film on said substrate, said first buffer film having uniaxial crystal texture characterized by (i) texture in a first crystallographic direction that extends out-of-plane of the first buffer film with no significant texture in a second direction that extends in-plane of the first buffer film, or (ii) texture in a first crystallographic direction that extends in-plane of the first buffer film with no significant texture in a second direction that extends out-of-plane of the first buffer film; and depositing a second buffer film with ion assist on said first buffer film, said second buffer film having a biaxial texture.

32. The method of claim 31, further comprising the step of depositing a superconductor layer on said second buffer film.

33. The method of claim 32, wherein said superconductor layer provides a Jc of at least 0.5 MA/cm$^2$ at 77 K and self-field.

34. The method of claim 31, wherein said article comprises a tape.

35. The method of claim 31, wherein a process comprising ion-beam assisted deposition (IBAD) is used to deposit said second buffer film.

* * * * *